United States Patent
Chen et al.

(10) Patent No.: US 11,335,646 B2
(45) Date of Patent: May 17, 2022

(54) SUBSTRATE STRUCTURE INCLUDING EMBEDDED SEMICONDUCTOR DEVICE AND METHOD OF MANUFACTURING THE SAME

(71) Applicant: Advanced Semiconductor Engineering, Inc., Kaohsiung (TW)

(72) Inventors: Chien-Fan Chen, Kaohsiung (TW); Yu-Ju Liao, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/814,704

(22) Filed: Mar. 10, 2020

(65) Prior Publication Data
US 2021/0287997 A1 Sep. 16, 2021

(51) Int. Cl.
*H01L 23/552* (2006.01)
*H01L 23/31* (2006.01)
(Continued)

(52) U.S. Cl.
CPC ........ *H01L 23/552* (2013.01); *H01L 21/4853* (2013.01); *H01L 21/4857* (2013.01);
(Continued)

(58) Field of Classification Search
CPC ............. H01L 21/4853; H01L 21/4857; H01L 21/565; H01L 23/5389; H01L 23/552;
(Continued)

(56) References Cited

U.S. PATENT DOCUMENTS 7,294,920 B2 * 11/2007 Chen ..................... H01L 21/486
257/698
9,373,605 B1 6/2016 Wang et al.
(Continued)

FOREIGN PATENT DOCUMENTS

JP 2017-191835 A 10/2017
JP 2019-021904 A 2/2019
(Continued)

OTHER PUBLICATIONS

Non-Final Office Action for U.S. Appl. No. 16/813,369, dated Sep. 9, 2021, 17 pages.
(Continued)

*Primary Examiner* — Luan C Thai
(74) *Attorney, Agent, or Firm* — Foley & Lardner LLP

(57) ABSTRACT

The present disclosure provides a substrate structure. The substrate structure includes an interconnection structure, a dielectric layer on the interconnection structure, an electronic component embedded in the dielectric layer, and a first conductive via penetrating through the dielectric layer and disposed adjacent to the electronic component. The interconnection structure includes a carrier having a first surface and a second surface opposite to the first surface, a first conductive layer disposed on the first surface of the carrier, and a second conductive layer disposed on the second surface of the carrier. The first conductive via and at least one of the first conductive layer and the second conductive layer define a first shielding structure surrounding the electronic component. A method of manufacturing a substrate structure is also disclosed.

21 Claims, 17 Drawing Sheets

(51) Int. Cl.
*H01L 23/538* (2006.01)
*H01L 21/56* (2006.01)
*H01L 21/48* (2006.01)

(52) U.S. Cl.
CPC ........ *H01L 21/565* (2013.01); *H01L 23/3128* (2013.01); *H01L 23/5383* (2013.01); *H01L 23/5386* (2013.01); *H01L 23/5389* (2013.01)

(58) Field of Classification Search
CPC ............. H01L 23/3128; H01L 23/5383; H01L 23/5386
USPC .................................................. 257/659, 660
See application file for complete search history.

(56) References Cited

U.S. PATENT DOCUMENTS

| | | | |
|---|---|---|---|
| 9,461,025 B2* | 10/2016 | Yu | ..................... H01L 21/32051 |
| 10,109,588 B2 | 10/2018 | Jeong et al. | |
| 2010/0006330 A1 | 1/2010 | Fu et al. | |
| 2011/0062471 A1 | 3/2011 | Bierhuizen et al. | |
| 2014/0124919 A1 | 5/2014 | Huang et al. | |
| 2014/0175663 A1 | 6/2014 | Chen et al. | |
| 2015/0296625 A1 | 10/2015 | Jung et al. | |
| 2017/0295643 A1 | 10/2017 | Suzuki et al. | |
| 2018/0114783 A1 | 4/2018 | Wang et al. | |
| 2018/0177045 A1 | 6/2018 | Schwarz et al. | |
| 2018/0358302 A1 | 12/2018 | Tuominen et al. | |
| 2019/0181126 A1 | 6/2019 | Cheah et al. | |
| 2019/0215958 A1 | 7/2019 | Ishihara et al. | |
| 2019/0267307 A1 | 8/2019 | Lin et al. | |
| 2019/0267351 A1 | 8/2019 | Jo et al. | |
| 2020/0020624 A1 | 1/2020 | Kang et al. | |
| 2020/0075503 A1* | 3/2020 | Chuang | ............... H01L 21/4817 |
| 2021/0125944 A1 | 4/2021 | Lambert et al. | |

FOREIGN PATENT DOCUMENTS

| | | |
|---|---|---|
| TW | 201901915 A | 1/2019 |
| WO | WO-2011/108308 A1 | 9/2011 |
| WO | WO-2016/181954 A1 | 11/2016 |
| WO | WO-2018/101384 A1 | 6/2018 |

OTHER PUBLICATIONS

Notice of Allowance for U.S. Appl. No. 16/813,369, dated Nov. 15, 2021, 9 pages.
Notice of Allowance for corresponding Taiwanese Patent Application No. 109122847, dated Jan. 22, 2022, 4 pages.
Search Report with English translation for corresponding Taiwanese Patent Application No. 109122847, dated Jan. 22, 2022, 2 pages.
Office Action and Search Report with English translation for corresponding Japanese Patent Application No. 2020-195425, dated Feb. 1, 2022, 6 pages.
Office Action for corresponding Taiwanese Patent Application No. 109122718, dated Mar. 2, 2022, 5 pages.
Search Report with English translation for corresponding Taiwanese Patent Application No. 109122718, dated Mar. 2, 2022, 2 pages.

* cited by examiner

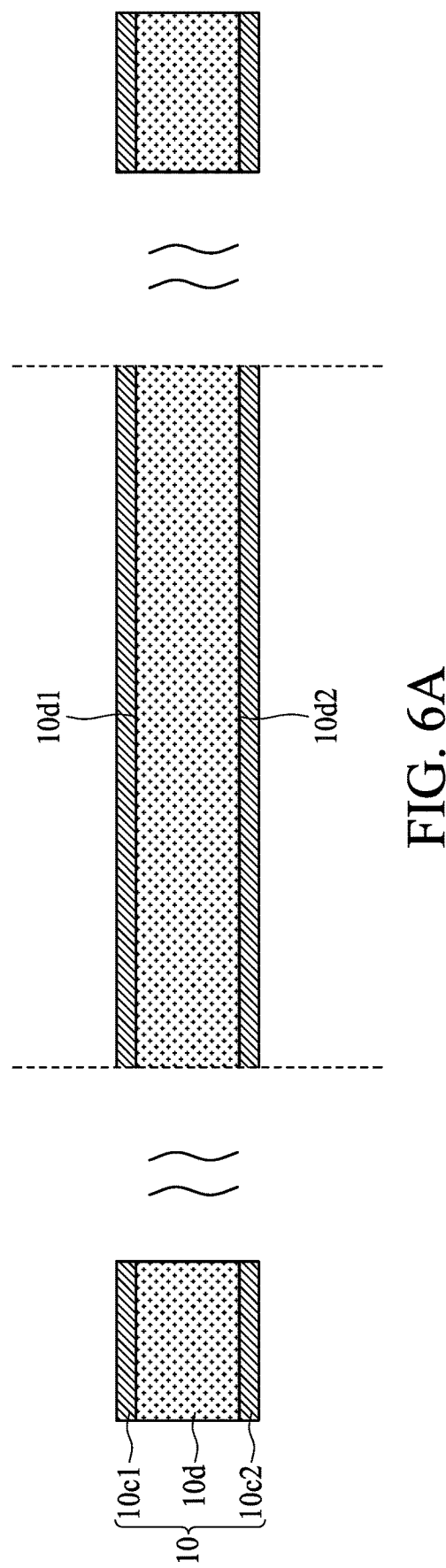

SUBSTRATE STRUCTURE INCLUDING EMBEDDED SEMICONDUCTOR DEVICE AND METHOD OF MANUFACTURING THE SAME

BACKGROUND

1. Technical Field

The present disclosure generally relates to a substrate and, in particular, to a substrate with an electronic component embedded therein.

2. Description of the Related Art

Embedded substrate technology is the inclusion of at least one active or passive electronic component within conductive layers of a substrate. The conductive layers facilitate electrical interconnection or signal transmission for an embedded electronic component. Embedded substrates are believed to reduce package size, increase power density and improve device performance, and thus have become increasingly popular.

SUMMARY

In one or more embodiments, the present disclosure provides a substrate structure. The substrate structure includes an interconnection structure, a dielectric layer on the interconnection structure, an electronic component embedded in the dielectric layer, and a first conductive via penetrating through the dielectric layer and disposed adjacent to the electronic component. The interconnection structure includes a carrier having a first surface and a second surface opposite to the first surface, a first conductive layer disposed on the first surface of the carrier, and a second conductive layer disposed on the second surface of the carrier. The first conductive via and at least one of the first conductive layer and the second conductive layer define a first shielding structure surrounding the electronic component.

In one or more embodiments, the present disclosure provides a semiconductor device package. The semiconductor device package includes an interconnection structure, a dielectric layer on the interconnection structure, a first electronic component embedded in the dielectric layer, and a first conductive via penetrating through the dielectric layer and disposed adjacent to the first electronic component. The interconnection structure includes a carrier having a first surface and a second surface opposite to the first surface, a first conductive layer disposed on the first surface of the carrier, and a second conductive layer disposed on the second surface of the carrier. The semiconductor device package further includes an encapsulating layer disposed on the second conductive layer, a second electronic component embedded in the encapsulating layer and electrically connected to the second conductive layer. The first conductive layer and the first conductive via define a first shielding structure surrounding the first electronic component.

In one or more embodiments, the present disclosure provides a method of manufacturing a substrate structure. The method includes providing an interconnection structure. The interconnection structure includes a carrier having a first surface and a second surface opposite to the first surface, a first conductive layer disposed on the first surface of the carrier, and a second conductive layer disposed on the second surface of the carrier. The method further includes attaching an electronic component to the interconnection structure and forming a first conductive via adjacent to the electronic component. The first conductive via electrically connects to at least one of the first conductive layer and the second conductive layer.

BRIEF DESCRIPTION OF THE DRAWINGS

Aspects of the present disclosure are readily understood from the following detailed description when read with the accompanying figures. It should be noted that various features may not be drawn to scale. The dimensions of the various features may be arbitrarily increased or reduced for clarity of discussion.

FIG. 6A illustrates one or more stages of a method of manufacturing a substrate structure in accordance with some embodiments of the present disclosure.

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1:
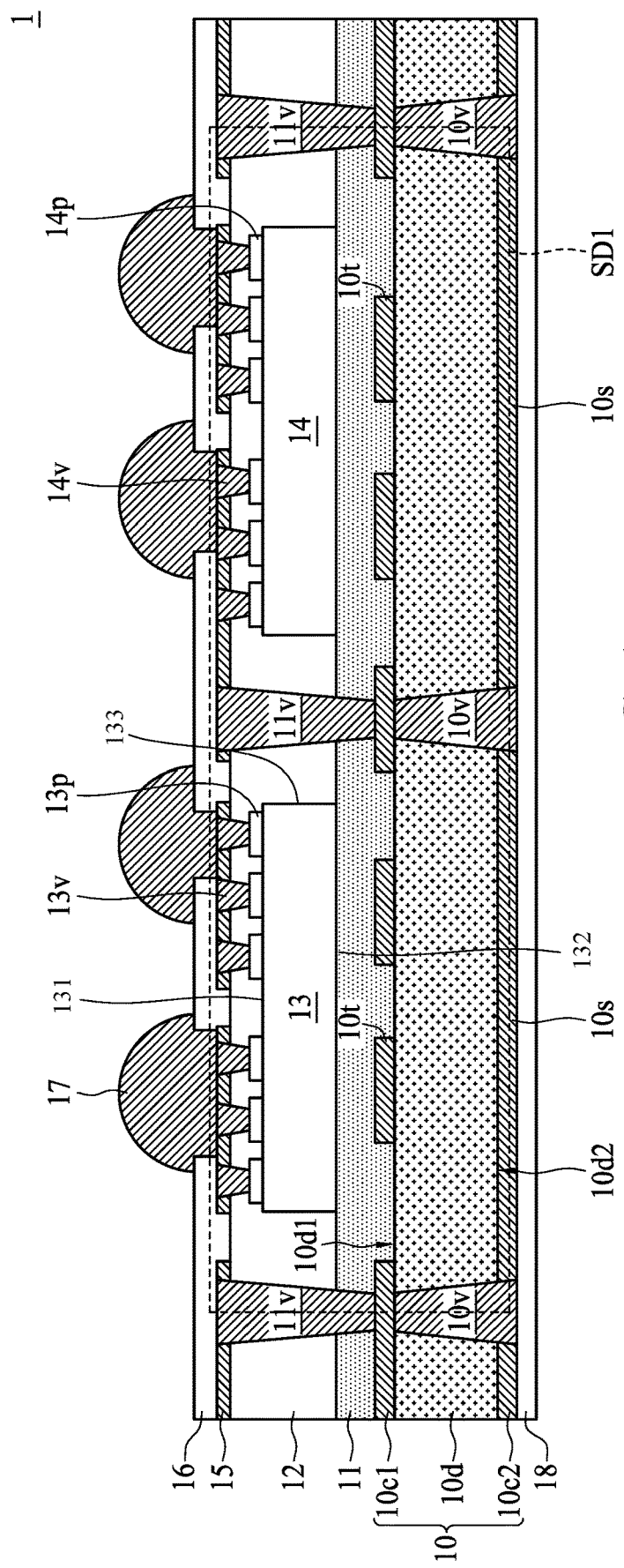
FIG. 1 is a cross-sectional view of a substrate structure, in accordance with an embodiment of the present disclosure.

The following disclosure provides for many different embodiments, or examples, for implementing different features of the provided subject matter. Specific examples of components and arrangements are described below. These are, of course, merely examples and are not intended to be limiting. In the present disclosure, reference to the formation of a first feature over or on a second feature in the description that follows may include embodiments in which the first and second features are formed in direct contact, and may also include embodiments in which additional features may be formed between the first and second features, such that the first and second features may not be in direct contact. Besides, the present disclosure may repeat reference numerals and/or letters in the various examples. This repetition is for simplicity and clarity and does not in itself dictate a relationship between the various embodiments and/or configurations discussed.

Embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

FIG. 1 is a cross-sectional view of a substrate structure 1, in accordance with an embodiment of the present disclosure. The substrate structure 1 includes an interconnection structure 10, dielectric layers 11, 12, an electronic components 13, 14, a conductive layer 15, a protecting layer 16, electrical contacts 17, 18.

The interconnection structure 10 includes a carrier 10$d$ having a surface 10$d$1 and a surface 10$d$2 opposite to the surface 10$d$1. The interconnection structure 10 further includes a conductive layer 10$c$1 disposed on the surface 10$d$1 and a conductive layer 10$c$2 disposed on the surface 10$d$2. A conductive via 10$v$ penetrates through the carrier 10$d$ and connects between the conductive layers 10$c$1 and 10$c$2. The conductive via 10$v$ tapers toward the conductive layer 10$c$1. For example, a width of the conductive via 10$v$ closer to the conductive layer 10$c$1 is substantially smaller than a width of the conductive via 10$v$ closer to the conductive layer 10$c$2.

In some embodiments, the interconnection structure 10 may include a copper clad laminate (CCL) substrate. In some embodiments, the carrier 10$d$ may include molding compounds, pre-impregnated composite fibers (e.g., prepreg), Borophosphosilicate Glass (BPSG), silicon oxide, silicon nitride, silicon oxynitride, Undoped Silicate Glass (USG), any combination of two or more thereof, or the like. In some embodiments, the carrier 10$d$ may include an organic material. In some embodiments, the carrier 10$d$ may include an organic material that further includes fillers such as glass fibers. In some embodiments, the carrier 10$d$ may have a thickness ranging from approximately 35 micrometers ($\mu$m) to approximately 400 $\mu$m.

In some embodiments, the conductive layers 10$c$1 and 10$c$2 may each include copper (Cu) or other conductive materials, such as aluminum (Al), chromium (Cr), tin (Sn), gold (Au), silver (Ag), nickel (Ni) or stainless steel, another metal, or a mixture, an alloy, or other combination of two or more thereof. In some embodiments, the conductive layers 10$c$1 and 10$c$2 may each have a thickness ranging from approximately 5 $\mu$m to approximately 18 $\mu$m.

The protecting layer 18 is disposed over the conductive layer 10$c$2 to encapsulate or cover the conductive layer 10$c$2. In some embodiments, the protecting layer 18 may fully expose or to expose at least a portion of the conductive via 10$v$ and/or the conductive layer 10$c$2 for electrical connections. In some embodiments, the protecting layer 18 may include a solder resist or a solder mask.

The electronic component 13 and the electronic component 14 are disposed over the conductive layer 10$c$1. The electronic component 13 has a surface (or may be referred to as an active surface) 131, a surface (or may be referred to as a backside surface) 132 opposite to the surface 131 and a lateral surface (or may be referred to as a lateral surface) 133 extending between the surface 131 and the surface 132.

In some embodiments, the electronic component 13 may be a chip or a die including a semiconductor substrate, one or more integrated circuit devices and one or more overlying interconnection structures therein. The integrated circuit devices may include active devices such as transistors and/or passive devices such as resistors, capacitors, inductors, or a combination thereof.

The electronic component 13 is attached to the interconnection structure 10 through the dielectric layer 11. For example, the dielectric layer 11 may be or may include a glue or an adhesive layer, and stick the surface 132 of the electronic component 13 on the conductive layer 10$c$1. The electronic component 13 includes a conductive pad 13$p$ and a conductive via 13$v$ on the surface 131 to provide electrical interconnection or signal transmission for the substrate structure 1. The electronic component 14 may have a similar structure and arrangement as the electronic component 13, and the similar description is omitted hereafter for the purpose of simplicity and clarity.

The dielectric layer 12 is disposed on the dielectric layer 11 and surrounds the electronic component 13 and the electronic component 14. The electronic component 13 and the electronic component 14 are embedded, encapsulated or covered in the dielectric layers 11 and 12.

In some embodiments, each of the dielectric layer 11 and the dielectric layer 12 may include lamination layers or films. In some embodiments, the dielectric layer 12 may include, for example, one or more organic materials (e.g., a molding compound, bismaleimide triazine (BT), a polyimide (PI), a polybenzoxazole (PBO), a solder resist, an Ajinomoto build-up film (ABF), a polypropylene (PP), an epoxy-based material, or a combination of two or more thereof), inorganic materials (e.g., silicon, a glass, a ceramic, a quartz, or a combination of two or more thereof), liquid-film material(s) or dry-film material(s), or a combination of two or more thereof. In some embodiments, an interface between the dielectric layer 11 and the dielectric layer 12 may be observed through a scanning electron microscope (SEM) or by other suitable technics. In some embodiments, the first dielectric layer 11 may be approximately 35 $\mu$m in thickness.

The conductive layer 15 is disposed on the dielectric layer 12 and electrically connects to the conductive via 13$v$ on the surface 131 of the electronic component 13. In some embodiments, the conductive layer 15 may include a material as listed above for the conductive layers 10$c$1 and 10$c$2.

The protecting layer 16 is disposed on the conductive layer 15 to fully expose or to expose at least a portion of the conductive via 13$v$ and/or the conductive layer 15 for electrical connections.

The electrical contact 17 (e.g. a solder ball) is disposed on the conductive via 13$v$ and/or the conductive layer 15 and can provide electrical connections between the substrate structure 1 and external components (e.g. external circuits or circuit boards). In some embodiments, the electrical contact 17 includes a controlled collapse chip connection (C4) bump, a ball grid array (BGA) or a land grid array (LGA).

A conductive via 11v is disposed within the dielectric layers 11 and 12. The conductive via 11v penetrates through the dielectric layers 11 and 12. The conductive via 11v connects between the conductive layers 10c1 and 15. The conductive via 11v connects with the conductive via 10v through the conductive layer 10c1.

As shown in FIG. 1, a shielding structure (labeled as "SD1") is formed in the substrate structure 1 and surrounds the electronic component 13 and the electronic component 14. The shielding structure SD1 provide an electromagnetic interference (EMI) protection to prevent the electronic component 13 and the electronic component 14 from being interfered by other electronic components, and vice versa. For example, the shielding structure SD1 may be defined by the conductive layer 10c2, the conductive via 10v, the conductive via 11v, and the conductive layer 15. In some embodiments, the shielding structure SD1 may include two shielding structures, one surrounding the electronic component 13 and the other surrounding the electronic component 14. This can further prevent the electronic component 13 and the electronic component 14 from being interfered by each other.

In some embodiments, the conductive layer 10c2 may be a conductive thin film. In some embodiments, the conductive layer 10c2 may be connected to ground. In some embodiments, the conductive layer 10c2 may be unpatterned. For example, the coverage percentage (or the density) of copper of the conductive layer 10c2 may be higher than the coverage percentage (or the density) of copper of the conductive layer 10c1.

In some embodiments, the conductive layer 10c1 may be a part of the shielding structure, and the conductive layer 10c2 may be patterned. As a result, the shielding structure is closer to the electronic components 13 and 14, which may inevitably introduce parasitic capacitance.

The conductive via 11v tapers toward the conductive layer 10c1. For example, a width of the conductive via 11v closer to the conductive layer 10c1 is substantially smaller than a width of the conductive via 11v closer to the conductive layer 15. The conductive via 11v and the conductive via 10v taper toward opposite directions. The conductive via 11v and the conductive via 10v taper toward each other.

In some existing approaches—unlike the substrate structure 1 which has an embedded electronic component (i.e., the electronic component 13) and an embedded shielding structure (i.e., the shielding structure SD1) according to the present disclosure—the substrate structure 1 may be packaged in a package body, and a shielding layer or frame may be provided on an outer surface of the package body by, for example, molding and sputtering operations. The operations thereof are high-cost and time consuming.

By comparison, in the present disclosure, the shielding structure SD1 is built in the substrate structure 1, which reduces package size. The shielding structure SD1 is manufactured by forming a conductive via in the dielectric layer 12 to connect to the conductive layer 10c2 and the conductive via 10v of the interconnection structure 10. The cost for forming the shielding structure SD1 is lower than for forming a shielding layer or frame on an outer surface of the package body.

In some other existing approaches, the electronic component (such as the electronic component 13) may be disposed in the carrier 10d. The conductive via 10v and the conductive layer 10c2 may provide EMI protection. However, to form a conductive via, different materials are drilled in a drilling process which may result in significant residual glass fibers in the carrier 10d. Such residual glass fibers are likely to cause electric disconnection of the later formed conductive via. In contrast, with the electronic component 13 disposed over the interconnection structure 10 according to the present disclosure, the problem with the existing approaches can be solved.

In the substrate structure 1, the conductive layer 10c2 is a part of the shielding structure SD1 and may be grounded, while the conductive layer 10c1 is patterned and may provide signal transmission. For example, the conductive layer 10c1 is patterned and may include a conductive trace portion 10t for signal transmission. The conductive layer 10c2 may include a grounding layer or a shielding portion 10s to provide an EMI protection.

Figure 2A:
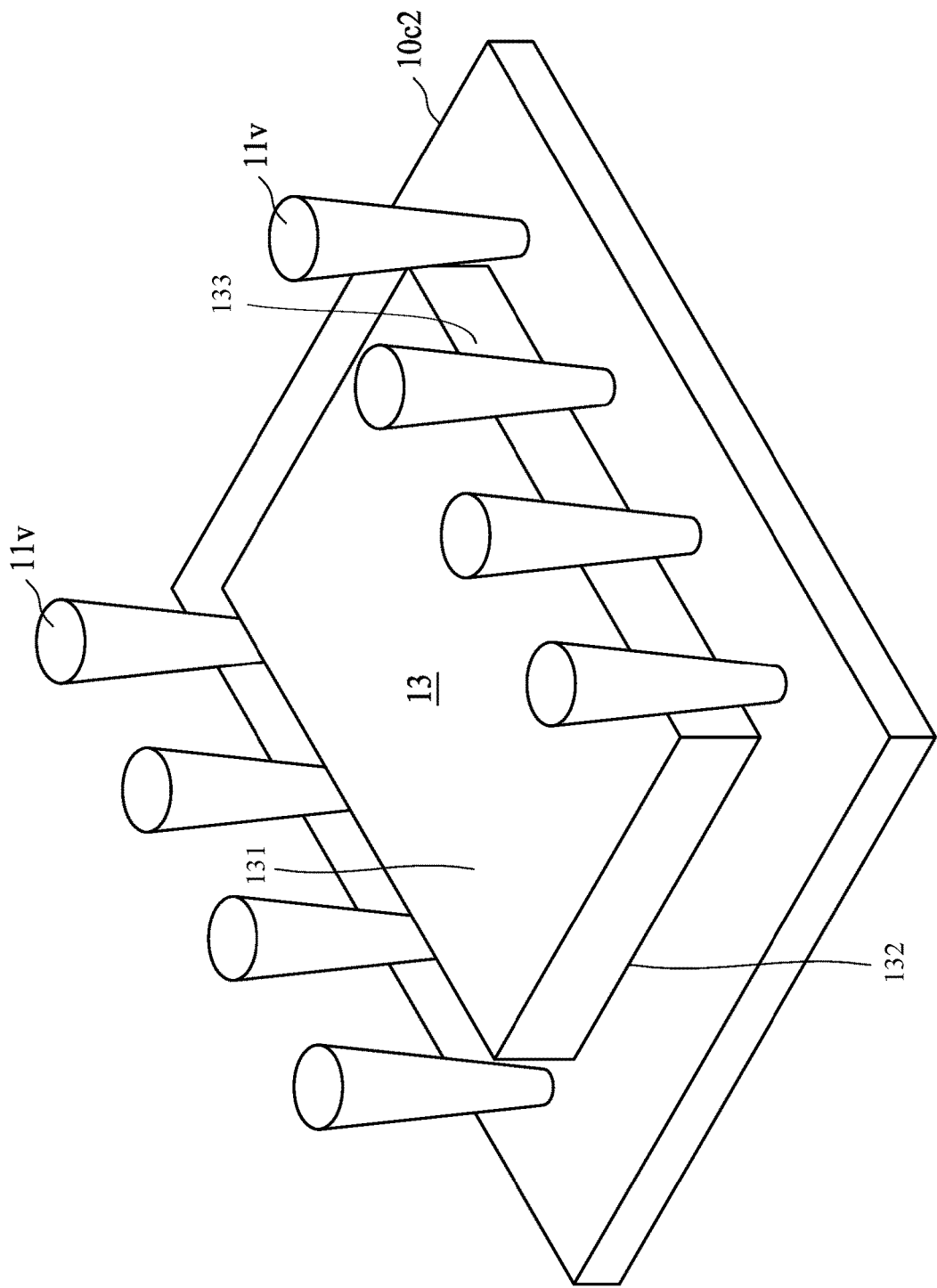
FIG. 2A is a schematic perspective view of an electromagnetic interference (EMI) shielding mechanism, in accordance with an embodiment of the present disclosure.

FIG. 2A is a schematic perspective view of an EMI shielding mechanism, in accordance with an embodiment of the present disclosure. In some embodiments, the structure in FIG. 2A may be a portion of the substrate structure 1 in FIG. 1. For the purpose of simplicity and clarity, only the conductive via 11v, the electronic component 13, and the conductive layer 10c2 are illustrated.

As shown in FIG. 2A, multiple conductive vias (or conductive pillars) 11v surround the electronic component 13. The conductive pillars 11v are electrically connected to the conductive layer 10c2 through the conductive via in the interconnection structure 10 (as shown in FIG. 1), and provide EMI protection for the electronic component 13.

The conductive pillars 11v are spaced apart from the electronic component 13. The conductive pillars 11v are disposed adjacent to the electronic component 13. The conductive pillars 11v are laterally spaced apart from the electronic component 13. For example, the surface 133 of the electronic component 13 faces the conductive via 11v.

In some embodiments, the number of the conductive pillars 11v associated with the conductive via 10v in the interconnection structure 10 (as shown in FIG. 1), their structure, and their deployment pattern may depend on desired applications.

Figure 2B:
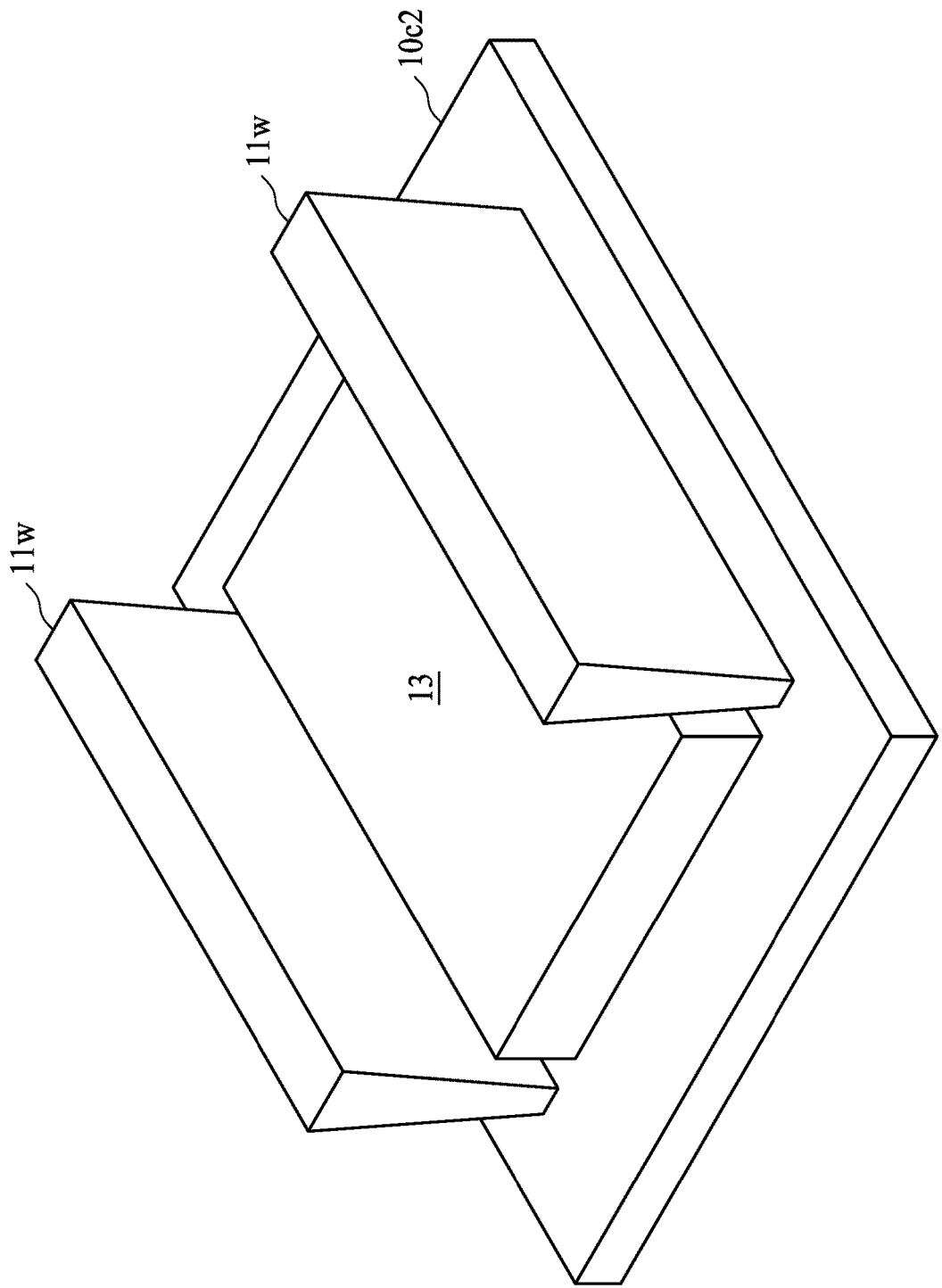
FIG. 2B is a schematic perspective view of an EMI shielding mechanism, in accordance with another embodiment of the present disclosure.

FIG. 2B is a schematic perspective view of an EMI shielding mechanism, in accordance with another embodiment of the present disclosure. In some embodiments, the structure in FIG. 2B may be a portion of the substrate structure 1 in FIG. 1. For the purpose of simplicity and clarity, only the conductive wall 11w, the electronic component 13, and the conductive layer 10c2 are illustrated.

As shown in FIG. 2B, the conductive walls 11w surround the electronic component 13. The surface 133 of the electronic component 13 faces the conductive walls 11w. The conductive walls 11w are electrically connected to the conductive layer 10c2 through the conductive via 10v in the interconnection structure 10 (as shown in FIG. 1), and provide EMI protection for the electronic component 13.

Figure 3:
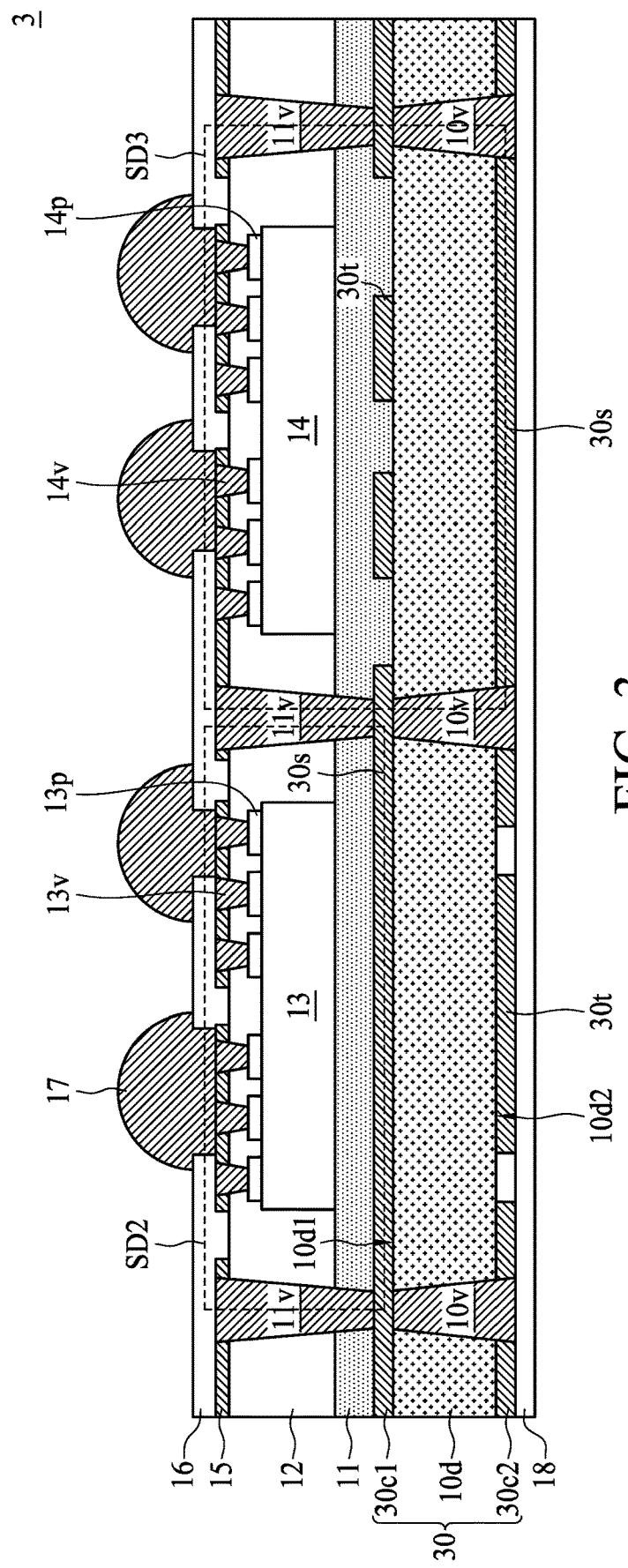
FIG. 3 is a cross-sectional view of a substrate structure, in accordance with another embodiment of the present disclosure.

FIG. 3 is a cross-sectional view of a substrate structure 3, in accordance with another embodiment of the present disclosure. In some embodiments, the substrate structure 3 in FIG. 3 is similar to the substrate structure 1 in FIG. 1, and the differences therebetween are described below.

The interconnection structure 30 includes a conductive layer 30c1 and a conductive layer 30c2. The conductive layer 30c1 is partially patterned. For example, the portion (labeled as "30t") of the conductive layer 30c1 directly under the electronic component 14 is patterned. In some embodiments, the conductive layer 30c1 includes a shielding portion 30s and a conductive trace portion 30t. The shielding portion 30s of the conductive layer 30c1 and the conductive via 11v define a shielding structure (labeled as "SD2") for providing an EMI protection for the electronic component 13. The conductive trace portion 30t of the conductive layer 30c1 is at the same level or layer as the shielding portion 30s.

Similar to the conductive layer 30c1, the conductive layer 30c2 is partially patterned. For example, the portion (labeled as "30t") of the conductive layer 30c2 directly under the electronic component 13 is patterned. In some embodiments, the conductive layer 30c2 includes a shielding portion 30s and a conductive trace portion 30t. The shielding portion 30s of the conductive layer 30c2, the conductive via 10v and the conductive via 11v define a shielding structure (labeled as "SD3") for providing an EMI protection for the electronic component 14. The conductive trace portion 30t of the conductive layer 30c2 is at the same level or layer as the shielding portion 30s.

The shielding structures SD3 and SD4 further prevent the electronic component 13 and the electronic component 14 from being interfered by each other.

Figure 4:
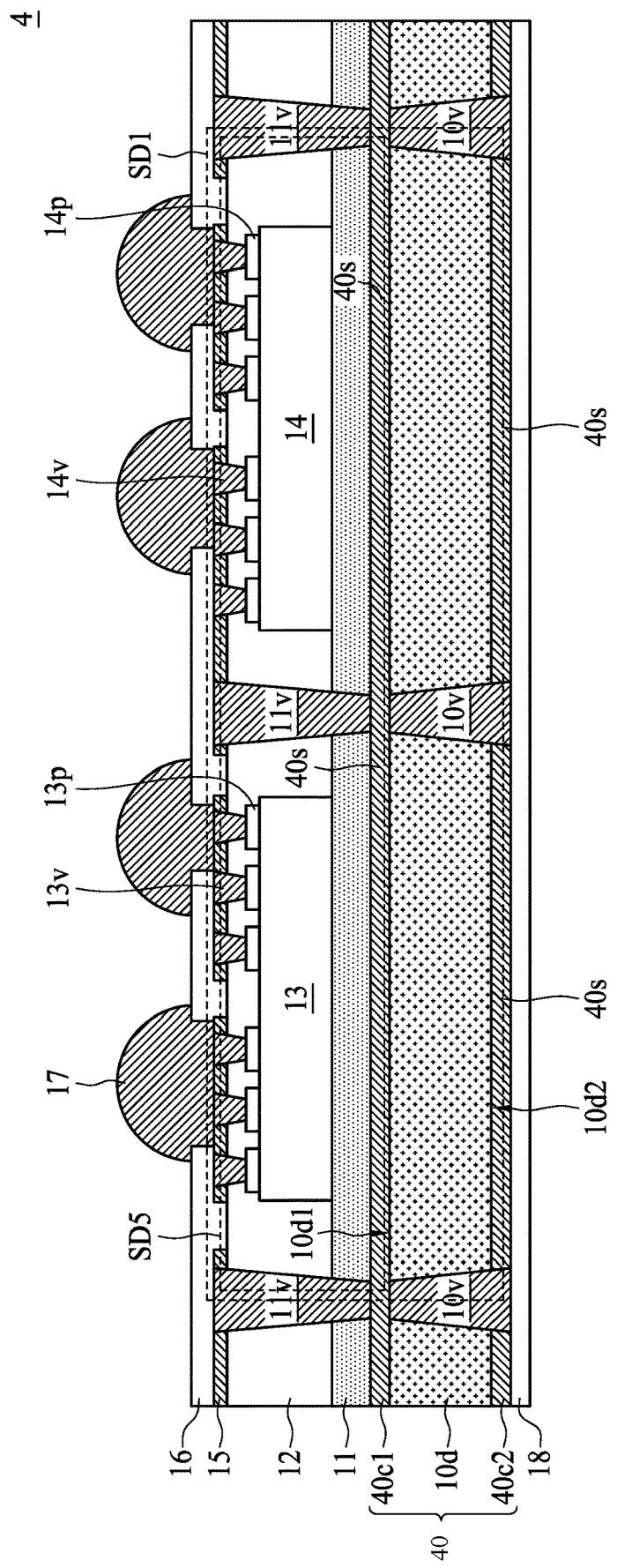
FIG. 4 is a cross-sectional view of a substrate structure, in accordance with still another embodiment of the present disclosure.

FIG. 4 is a cross-sectional view of a substrate structure 4, in accordance with another embodiment of the present disclosure. In some embodiments, the substrate structure 4 in FIG. 4 is similar to the substrate structure 1 in FIG. 1, and the differences therebetween are described below.

The interconnection structure 40 includes a conductive layer 40c1 and a conductive layer 40c2. The conductive layer 40c2, the conductive via 10v and the conductive via 11v define a shielding structure (labeled as "SD1") for providing an EMI protection for the electronic components 13 and 14. The conductive layer 40c1 and the conductive via 11v define a shielding structure (labeled as "SD5") for providing an EMI protection for the electronic components 13 and 14. The shielding structure SD5 is formed within the shielding structure SD1. The shielding structures SD1 and SD5 together form a two-layered shielding structure for the electronic components 13 and 14.

Figure 5A:
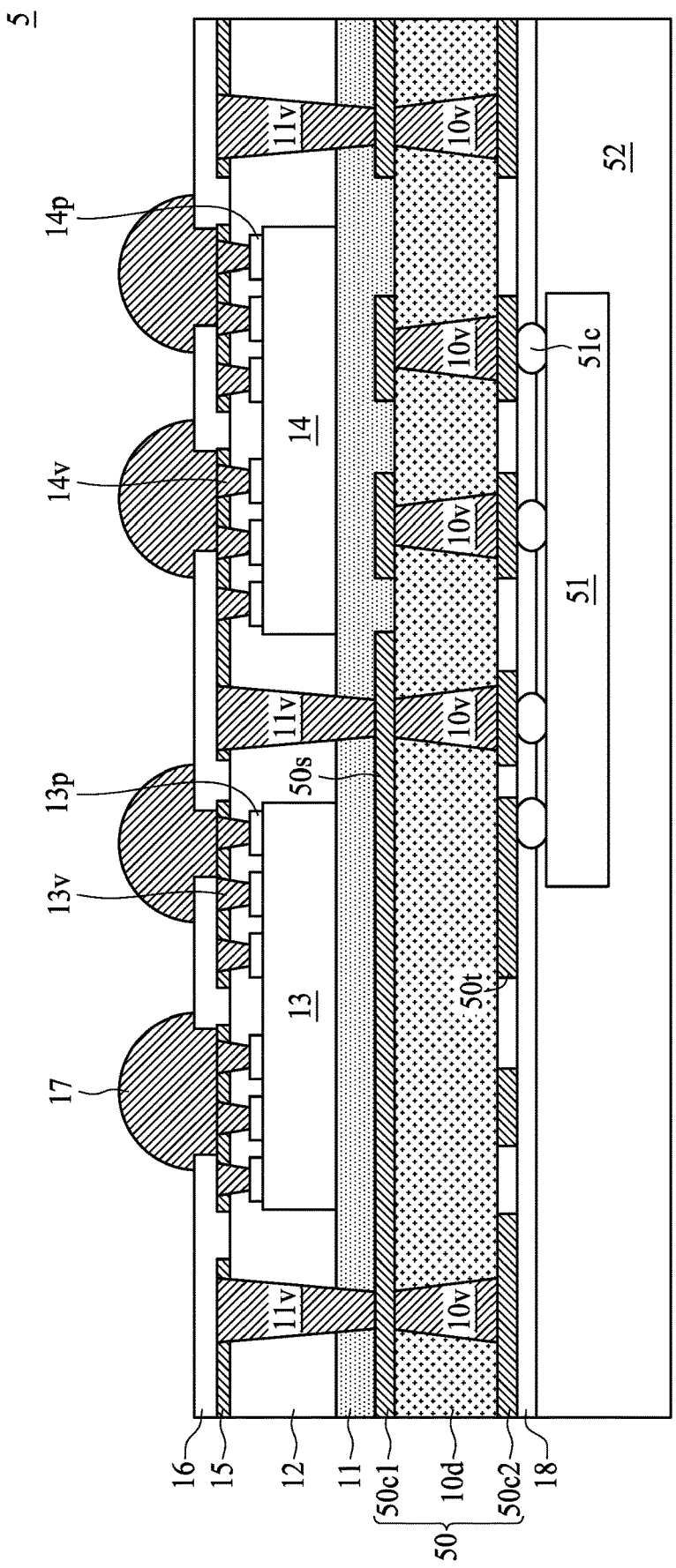
FIG. 5A is a cross-sectional view of a semiconductor device package, in accordance with yet another embodiment of the present disclosure.

FIG. 5A is a cross-sectional view of a substrate structure 5, in accordance with another embodiment of the present disclosure. In some embodiments, the substrate structure 5 in FIG. 5A is similar to the substrate structure 1 in FIG. 1, and the differences therebetween are described below.

The substrate structure 5 includes an electronic component 51 disposed on the interconnection structure 50. The electronic component 51 is disposed on an opposite side of the interconnection structure 50 with respect to the electronic component 13. The electronic component 51 is electrically connected to the conductive layer 50c2 through the electrical contact 51c. An encapsulating layer 52 is disposed on the top surface of the protecting layer 18 to cover or encapsulate the electronic component 51. In some embodiments, the encapsulating layer 52 includes an epoxy resin having fillers, a molding compound (e.g., an epoxy molding compound or other molding compound), a polyimide, a phenolic compound or material, a material with a silicone dispersed therein, or a combination thereof.

Figure 5B:
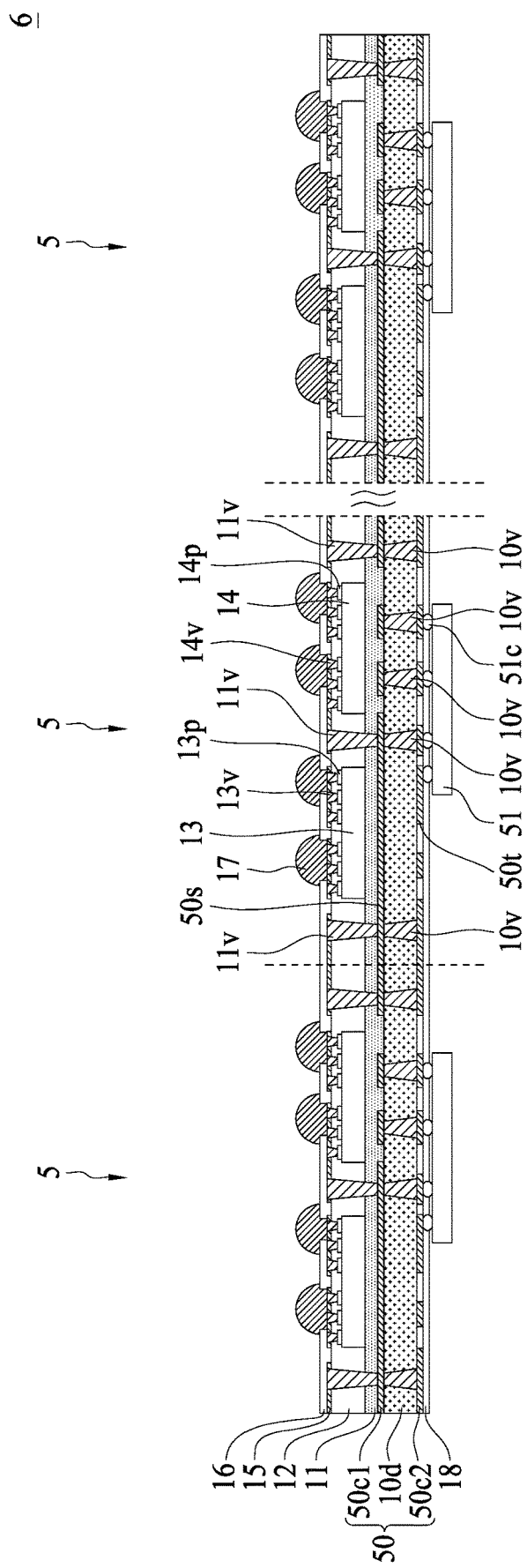
FIG. 5B is a cross-sectional view of a semiconductor device package, in accordance with yet still another embodiment of the present disclosure.

FIG. 5B is a cross-sectional view of a substrate structure 6, in accordance with another embodiment of the present disclosure. The substrate structure 6 includes several units (such as the substrate structures 5) that one may be separable from another by a scribe line.

FIG. 6 is a cross-sectional view of a substrate structure 6, in accordance with another embodiment of the present disclosure. In the interconnection structure 50 includes a CCL substrate, which includes several units that one may be separable from another by a scribe line.

FIG. 6A, FIG. 6B, FIG. 6C, FIG. 6D, FIG. 6E, FIG. 6F, FIG. 6G, FIG. 6H, FIG. 6I, and FIG. 6J are cross-sectional views of a wiring structure at various stages of fabrication, in accordance with some embodiments of the present disclosure. At least some of these figures have been simplified for a better understanding of the aspects of the present disclosure.

Referring to FIG. 6A, an interconnection structure 10 is provided. The interconnection structure 10 includes a carrier 10d having a surface 10d1 and a surface 10d2 opposite to the surface 10d1. The interconnection structure 10 includes a conductive layer 10c1 on the surface 10d1 and a conductive layer 10c2 on the surface 10d2. The carrier 10d may include a dielectric layer, and may include fillers such as glass fibers.

In the present embodiment, the interconnection structure 10 includes a CCL substrate, which includes several units that one may be separable from another by a scribe line. Since each of the units is subjected to similar or identical processes in the manufacturing method, for convenience, only an exemplary unit is illustrated and described in the following description.

Figure 6B:
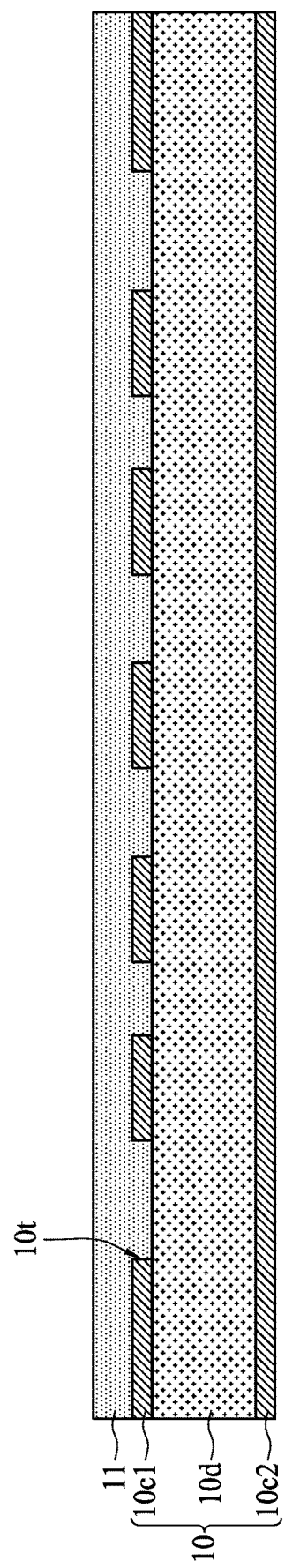
FIG. 6B illustrates one or more stages of a method of manufacturing a substrate structure in accordance with some embodiments of the present disclosure.

Referring to FIG. 6B, the conductive layer 10c1 is patterned in, for example, a lithographic process followed by an etching process, resulting in a patterned conductive layer. The patterned conductive layer may include, also referring to FIG. 1, conductive pads or conductive traces 10t or both to facilitate electric interconnection or signal transmission. Next, a dielectric layer 11 is formed on the surface 10d1 of the carrier 10d, covering the conductive traces 10t. Suitable materials for the first dielectric layer 11 may be selected from those having desired adherence to facilitate attachment of, for example, a semiconductor device or an electronic component. In some embodiments, the dielectric layer 11 includes a resin. Moreover, the dielectric layer 11 may be free from fillers such as glass fibers.

Figure 6C:
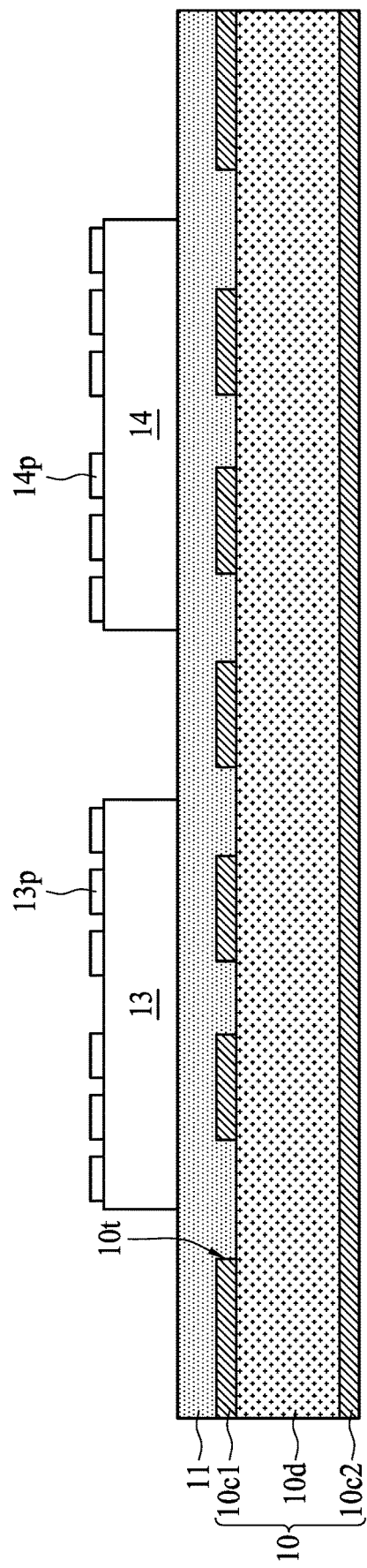
FIG. 6C illustrates one or more stages of a method of manufacturing a substrate structure in accordance with some embodiments of the present disclosure.

Afterward, referring to FIG. 6C, electronic components 13 and 14 are attached to the dielectric layer 11. The electronic components 13 and 14 are oriented "face-up" with its conductive pads 13p and 14p facing away from the dielectric layer 11. The electronic components 13 and 14 may each include an active device or a passive device.

Figure 6D:
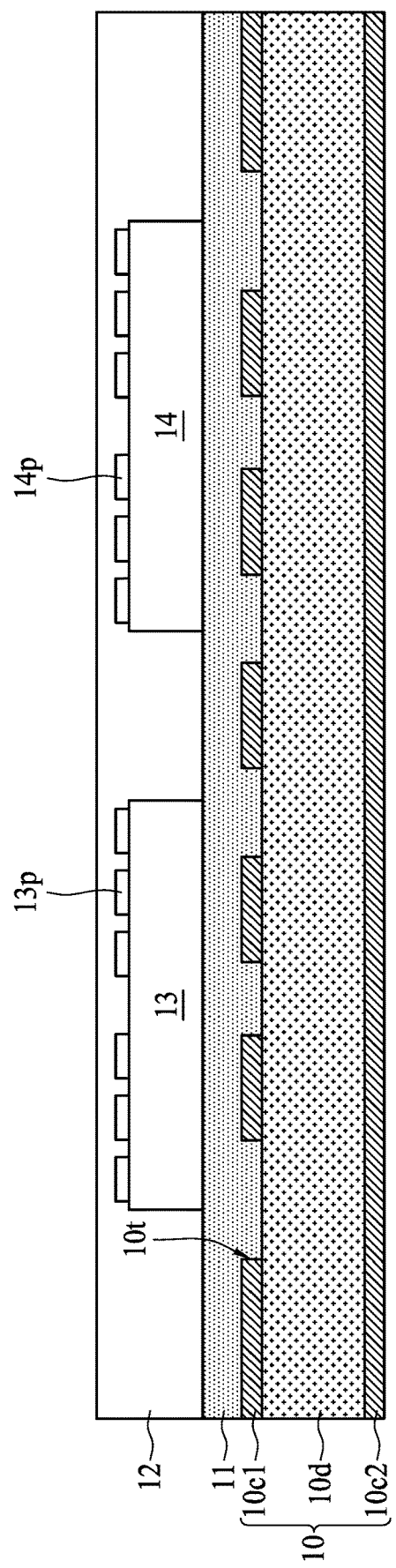
FIG. 6D illustrates one or more stages of a method of manufacturing a substrate structure in accordance with some embodiments of the present disclosure.

Referring to FIG. 6D, a dielectric layer 12 is formed on the dielectric layer 11, covering the electronic components 13 and 14. Suitable materials for the dielectric layer 12 are similar to or identical with those for the dielectric layer 11. In particular, like the dielectric layer 11, the dielectric layer 12 may include resin free from glass fibers.

Figure 6E:
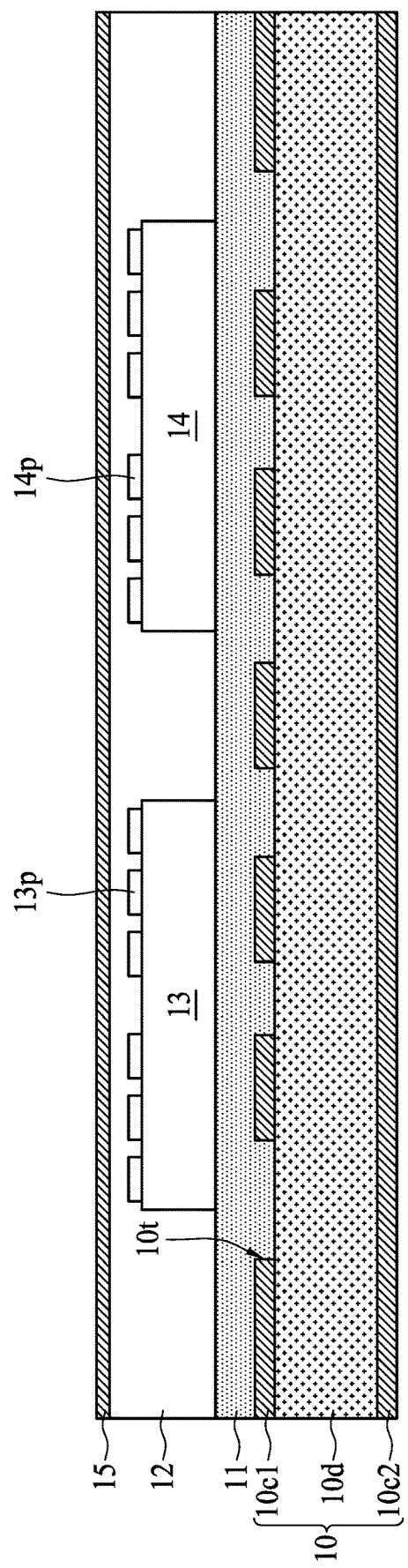
FIG. 6E illustrates one or more stages of a method of manufacturing a substrate structure in accordance with some embodiments of the present disclosure.

Referring to FIG. 6E, a conductive layer 15 is formed on a surface of the dielectric layer 12 in, for example, a lamination process. Suitable materials for the conductive layer 15 may include Cu.

Figure 6F:
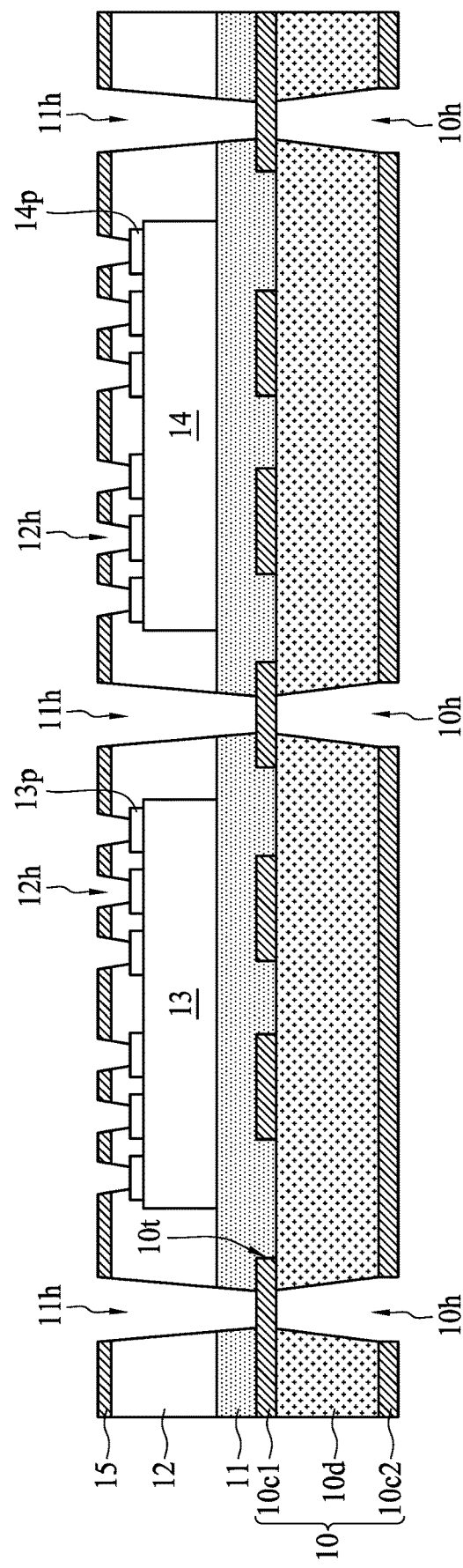
FIG. 6F illustrates one or more stages of a method of manufacturing a substrate structure in accordance with some embodiments of the present disclosure.

Subsequently, referring to FIG. 6F, the conductive layer 15 is patterned, resulting in a patterned conductive layer 15. The patterned conductive layer 15 exposes first portions (not numbered) of the dielectric layer 12, which correspond in position to the conductive via (such as the conductive via 11v as shown in FIG. 1). In addition, the patterned conductive layer 15 exposes second portions (not numbered) of the dielectric layer 12, which correspond in position to the conductive pads 13p and 14p.

Then, first openings 11h are formed into the exposed first portions in, for example, a laser drilling process that may use carbon dioxide ($CO_2$) laser, exposing the conductive traces 10t in the patterned conductive layer 10c1. The first openings 12h extend through the dielectric layer 12 and the dielectric layer 11 towards the conductive traces 10t. In addition, second openings 12h are formed into the exposed second portions by using, for example, a blasting process, exposing the conductive pads 13p and 14p.

In addition, the conductive layer 10c2 is patterned, resulting in a patterned conductive layer 10c2, which exposes portions of the carrier 10d. Then, openings 10h are formed into the carrier 10d from the exposed portions thereof by using, for example, laser drilling, exposing portions of the conductive traces 10t.

In some embodiments, the openings 10h and the openings 11h are formed by using laser drilling. In forming the openings 11h, which extend through a dielectric layer free from glass fibers, laser is applied at a first pulsed energy. By comparison, in forming the openings 10h, which extend through a dielectric layer filled with glass fibers, laser is applied at a second pulsed energy. The second pulsed energy is higher than the first pulsed energy.

Figure 6G:
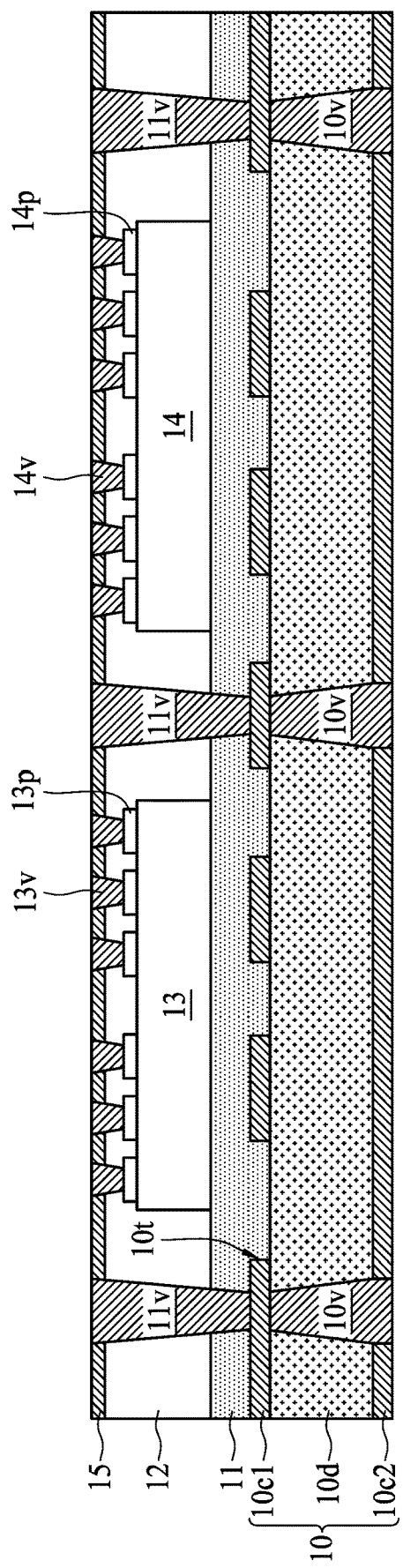
FIG. 6G illustrates one or more stages of a method of manufacturing a substrate structure in accordance with some embodiments of the present disclosure.

Next, referring to FIG. 6G, a conductive material is formed on the patterned conductive layer 15 in, for example, a plating process. The conductive material fills the openings 11h and the openings 12h, resulting in the conductive vias 11v and the conductive vias 13v and 14v. In the present embodiment, the conductive vias 11v taper towards the conductive layer 10c1. The first conductive layer also disposed on the patterned first conductive foil p23.

Similarly, a conductive material is formed on the patterned conductive layer 10c2 in, for example, a plating process. The conductive material fills the openings 10h, resulting in the conductive vias 10v.

The conductive layer 10c2, the conductive via 10v, the conductive via 10v, and the conductive layer 15 define a shielding structure surrounding the electronic component 13 and the electronic component 14.

In some embodiments, a seed layer (not shown in the figures) may be disposed conformally on the sidewalls of the openings 10h, the openings 11h, and the openings 12h. In some embodiments, the seed layer may be formed by sputtering titanium and copper (Ti/Cu) or a titanium-tungsten alloy (TiW). In some embodiments, the seed layer may be formed by electroless plating Ni or Cu.

Figure 6H:
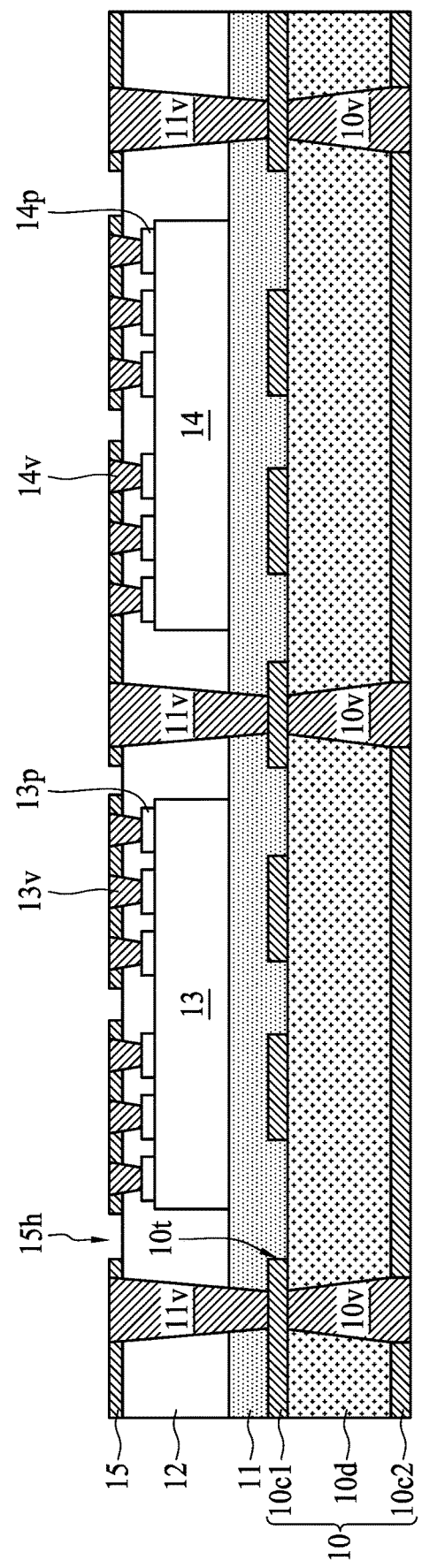
FIG. 6H illustrates one or more stages of a method of manufacturing a substrate structure in accordance with some embodiments of the present disclosure.

Next, referring to FIG. 6H, the patterned conductive layer 15 is subjected to a patterning process to form holes 15h, which electrically isolate some of these conductive vias 11v, 13v and 14v and define conductive traces for electric interconnection.

Figure 6I:
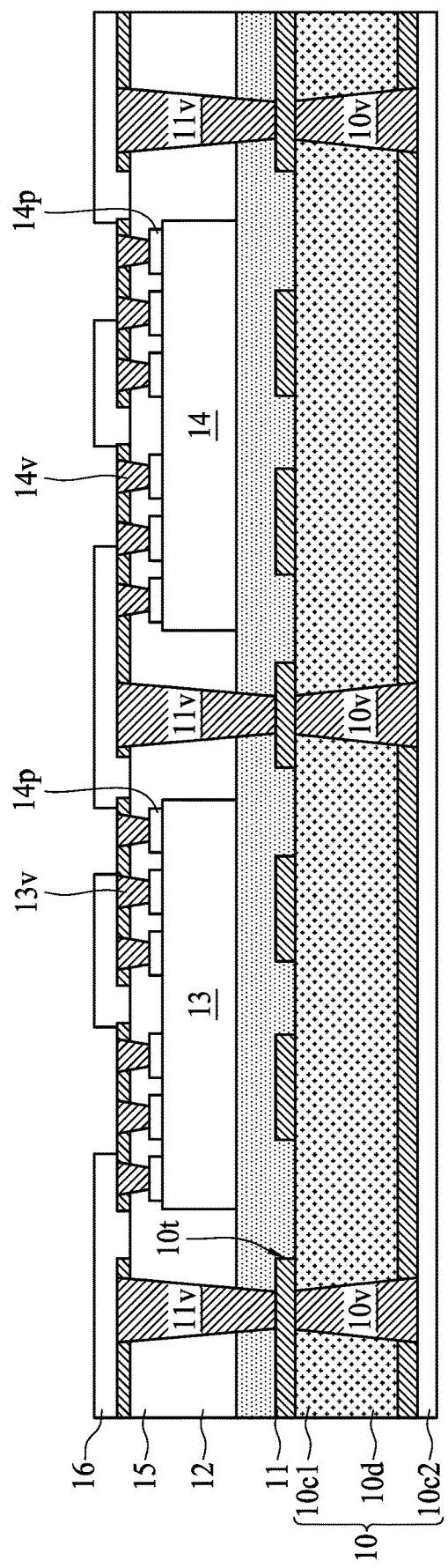
FIG. 6I illustrates one or more stages of a method of manufacturing a substrate structure in accordance with some embodiments of the present disclosure.

Next, referring to FIG. 6I, a protecting layer 16 such as solder mask is applied on the patterned conductive layer 15, exposing the conductive vias 13v and the conductive vias 14v. The protecting layer 16 helps control the movement of solder balls to be formed on the exposed conductive vias 13v and the conductive vias 14v during soldering.

Figure 6J:
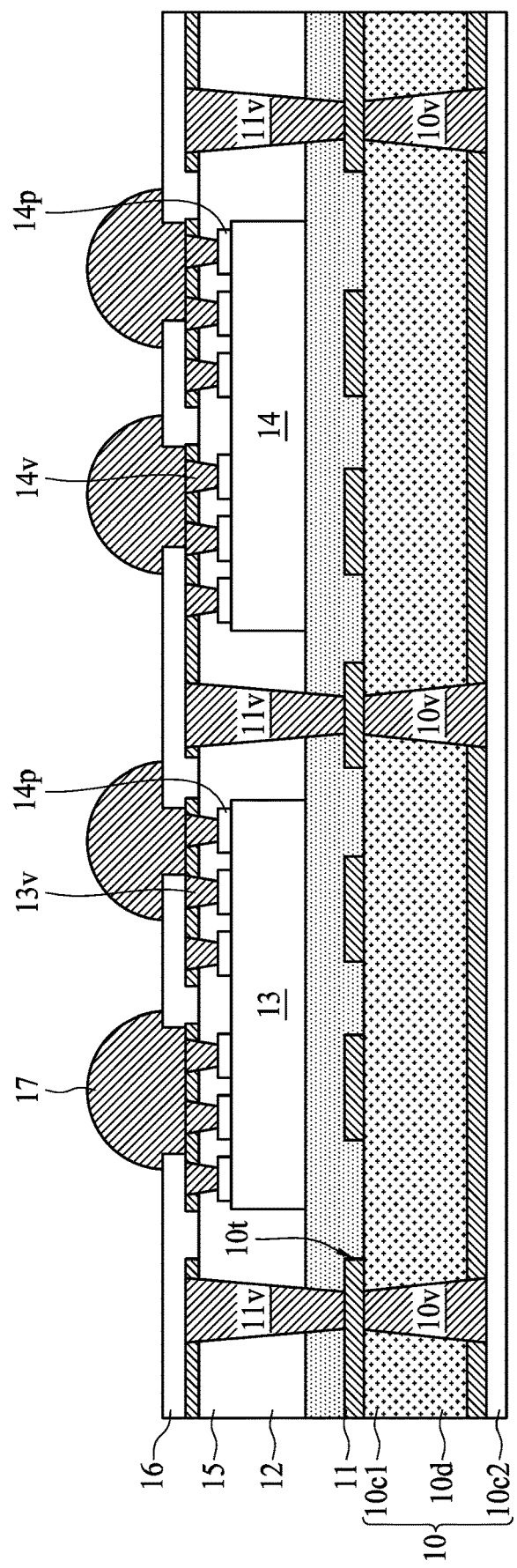
FIG. 6J illustrates one or more stages of a method of manufacturing a substrate structure in accordance with some embodiments of the present disclosure.

Subsequently, referring to FIG. 6J, electrical contacts 17 are provided on the exposed conductive vias 13v and the conductive vias 14v.

In some embodiments, an electronic component (such as the electronic component 51 in FIG. 5A) may be provided on the interconnection structure 10 and electrically connected to the conductive layer 10c2. In some embodiments, an Referring to FIG. 7O, an encapsulating layer (such as the encapsulating layer 52 in FIG. 5A) may be formed on the interconnection structure 10 to cover or encapsulate the electronic component. In some embodiments, the encapsulating layer may be formed by a molding technique, such as transfer molding or compression molding. In some embodiments, a singulation may be performed to separate out individual substrate structures or semiconductor device package devices. The singulation may be performed, for example, by using a dicing saw, laser or other appropriate cutting technique.

Spatially relative terms, such as "beneath," "below," "lower," "above," "upper," "left," "right" and the like, may be used herein for ease of description to describe one element or feature's relationship to another element(s) or feature(s) as illustrated in the figures. The spatially relative terms are intended to encompass different orientations of the device in use or operation, in addition to the orientation depicted in the figures. The apparatus may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

As used herein, the terms "approximately", "substantially", "substantial" and "about" are used to describe and account for small variations. When used in conduction with an event or circumstance, the terms can refer to instances in which the event or circumstance occurs precisely as well as instances in which the event or circumstance occurs to a close approximation. As used herein with respect to a given value or range, the term "about" generally means within ±10%, ±5%, ±1%, or ±0.5% of the given value or range. Ranges can be expressed herein as from one endpoint to another endpoint or between two endpoints. All ranges disclosed herein are inclusive of the endpoints unless specified otherwise. The term "substantially coplanar" can refer to two surfaces within micrometers (μm) of lying along the same plane, such as within 10 μm, within 5 μm within 1 μm, or within 0.5 μm of lying along the same plane. When referring to numerical values or characteristics as "substantially" the same, the term can refer to the values lying within ±10%, ±5%, ±1%, or ±0.5% of an average of the values.

The foregoing outlines features of several embodiments and detailed aspects of the present disclosure. The embodiments described in the present disclosure may be readily used as a basis for designing or modifying other processes and structures for carrying out the same or similar purposes and/or achieving the same or similar advantages of the embodiments introduced herein. Such equivalent constructions do not depart from the spirit and scope of the present disclosure, and various changes, substitutions, and alterations may be made without departing from the spirit and scope of the present disclosure.

What is claimed is:

1. A substrate structure, comprising:
    an interconnection structure, wherein the interconnection structure includes a carrier having a first surface and a second surface opposite to the first surface, a first conductive layer disposed on the first surface of the carrier, and a second conductive layer disposed on the second surface of the carrier;
    a first dielectric layer on the interconnection structure;
    a second dielectric layer on the first dielectric layer;
    an electronic component embedded in the second dielectric layer; and
    a first conductive via penetrating through the first dielectric layer and the second dielectric layer and disposed adjacent to the electronic component;
    wherein the first conductive via and at least one of the first conductive layer and the second conductive layer define a first shielding structure surrounding the electronic component.

2. The substrate structure of claim 1, wherein the electronic component has an active surface facing away from the interconnection structure, a backside surface opposite to the active surface, and a lateral surface extending between the active surface and the backside surface; wherein the lateral surface of the electronic component faces the first conductive via.

3. The substrate structure of claim 1, wherein the first conductive layer includes a conductive trace for signal transmission.

4. The substrate structure of claim 1, wherein the first conductive layer includes a shielding portion for defining the first shielding structure and a conductive trace portion for signal transmission.

5. The substrate structure of claim 1, wherein the first conductive via taper towards the first conductive layer.

6. The substrate structure of claim 1, further comprising:
a second conductive via connected between the first conductive layer and the second conductive layer, wherein the second conductive via tapers towards the first conductive layer.

7. The substrate structure of claim 6, wherein the first conductive via and the first conductive layer define the first shielding structure surrounding the electronic component, and the second conductive layer and the second conductive via define a second shielding structure surrounding the electronic component.

8. The substrate structure of claim 1, wherein the first conductive via include at least one of conductive pillars or conductive walls.

9. The substrate structure of claim 1, further comprising:
a conductive layer disposed on the second dielectric layer and electrically connected with the first conductive via.

10. A semiconductor device package, comprising:
an interconnection structure, wherein the interconnection structure includes a carrier having a first surface and a second surface opposite to the first surface, a first conductive layer disposed on the first surface of the carrier, and a second conductive layer disposed on the second surface of the carrier;
a dielectric layer on the first conductive layer;
a first electronic component embedded in the dielectric layer;
an encapsulating layer disposed on the second conductive layer;
a second electronic component embedded in the encapsulating layer and electrically connected to the second conductive layer; and
a first conductive via penetrating through the dielectric layer and disposed adjacent to the first electronic component;
wherein the first conductive layer and the first conductive via define a first shielding structure surrounding the first electronic component;
wherein the first electronic component has an active surface facing away from the interconnection structure and a backside surface opposite to the active surface, and wherein the first conductive via exceeds over the backside surface.

11. The semiconductor device package of claim 10, wherein the first electronic component has a lateral surface extending between the active surface and the backside surface; wherein the lateral surface of the first electronic component faces the first conductive via.

12. The semiconductor device package of claim 10, wherein the first conductive layer includes a conductive trace for signal transmission.

13. The semiconductor device package of claim 10, wherein the first conductive layer includes a shielding portion for defining the first shielding structure and a conductive trace portion for signal transmission.

14. The semiconductor device package of claim 10, wherein the first conductive via taper towards the first conductive layer.

15. The semiconductor device package of claim 10, further comprising:
a second conductive via connected between the first conductive layer and the second conductive layer, wherein the second conductive via tapers towards the first conductive layer.

16. The semiconductor device package of claim 15, wherein the first conductive via and the first conductive layer define the first shielding structure surrounding the first electronic component, and the second conductive layer and the second conductive via define a second shielding structure surrounding the first electronic component.

17. The semiconductor device package of claim 10, wherein the first conductive via include at least one of conductive pillars or conductive walls.

18. A method of manufacturing a substrate structure, comprising:
providing an interconnection structure, wherein the interconnection structure includes a carrier having a first surface and a second surface opposite to the first surface, a first conductive layer disposed on the first surface of the carrier, and a second conductive layer disposed on the second surface of the carrier;
attaching an electronic component to the interconnection structure; and
after attaching the electronic component to the interconnection structure, forming a first conductive via adjacent to the electronic component, wherein the first conductive via electrically connects to at least one of the first conductive layer and the second conductive layer.

19. The method of claim 18, further comprising:
forming a dielectric layer on the interconnection structure; and
patterning the dielectric layer, resulting in a first opening exposing a portion of the first conductive layer.

20. The method of claim 19, further comprising:
filling the first opening with a conductive material, resulting in first conductive vias.

21. The semiconductor device package of claim 15, wherein the first conductive via and the second conductive via contact opposite sides of the first conductive layer.

* * * * *